United States Patent
Hattori et al.

(10) Patent No.: US 8,318,582 B2
(45) Date of Patent: Nov. 27, 2012

(54) METHOD OF FORMING A TRENCH ISOLATION

(75) Inventors: Seitarou Hattori, Tokyo (JP); Manabu Sekiguchi, Tokyo (JP); Terukazu Kokubo, Tokyo (JP); Kentaro Tamaki, Tokyo (JP); Tsuyoshi Furukawa, Tokyo (JP); Taichi Matsumoto, Tokyo (JP); Chiaki Miyamoto, Tokyo (JP)

(73) Assignee: JSR Corporation, Tokyo (JP)

( * ) Notice: Subject to any disclaimer, the term of this patent is extended or adjusted under 35 U.S.C. 154(b) by 18 days.

(21) Appl. No.: 12/865,808

(22) PCT Filed: Jan. 30, 2009

(86) PCT No.: PCT/JP2009/052004
§ 371 (c)(1),
(2), (4) Date: Nov. 9, 2010

(87) PCT Pub. No.: WO2009/096603
PCT Pub. Date: Aug. 6, 2009

(65) Prior Publication Data
US 2011/0053340 A1    Mar. 3, 2011

(30) Foreign Application Priority Data
Feb. 1, 2008   (JP) .................................. 2008-022357

(51) Int. Cl.
*H01L 21/76* (2006.01)
(52) U.S. Cl. ........................ 438/424; 438/780; 438/787
(58) Field of Classification Search .................. 438/424, 438/780, 781, 787–789
See application file for complete search history.

(56) References Cited

U.S. PATENT DOCUMENTS

| | | | |
|---|---|---|---|
| 7,314,837 B2 * | 1/2008 | Li et al. .................... | 438/787 |
| 7,745,352 B2 * | 6/2010 | Mallick et al. ............. | 438/789 |
| 2004/0096593 A1 * | 5/2004 | Lukas et al. ................ | 427/558 |
| 2010/0188766 A1 | 7/2010 | Harimoto et al. | |

FOREIGN PATENT DOCUMENTS

| | | |
|---|---|---|
| JP | 59 66422 | 4/1984 |
| JP | 61 198633 | 9/1986 |
| JP | 2007-45859 | 2/2007 |
| WO | WO 2007018283 A1 * | 2/2007 |
| WO | WO 2007046560 A2 * | 4/2007 |

OTHER PUBLICATIONS

Brinkler, C. J., "Hydrolysis and condensation of silicates: effects on structure," 1988 J. of Non-crystalline Solids vol. 100 p. 31-50.*
Molenberg, A. et al., "A fast catalyst system for the ring-opening polymerization of cyclosiloxanes," 1995 Macromol. Rapid Commun. vol. 16 p. 449-453.*
Seyferth, D. et al., "Cyclic polysiloxanes from the hydrolysis of dichlorosilane," 1983 Inorg. Chem. vol. 22 p. 2163-2167.*
Kazuo Maeda. "First Semiconductor Process", Kogyo Chosakai Publishing Co., Ltd., 2001, pp. 166-173 (with partial English translation).

* cited by examiner

*Primary Examiner* — Fernando L Toledo
*Assistant Examiner* — Bryan Junge
(74) *Attorney, Agent, or Firm* — Oblon, Spivak, McClelland, Maier & Neustadt, L.L.P.

(57) ABSTRACT

A method of forming a trench isolation, comprising the steps of:
applying a silicone resin composition comprising a silicone resin which is represented by the following rational formula (1) and is solid at 120° C.:

$$(H_2SiO)_n (HSiO_{1.5})_m (SiO_2)_k \qquad (1)$$

(wherein n, m and k are each a number, with the proviso that when n+m+k=1, n is 0 to 0.8, m is 0 to 1.0, and k is 0 to 0.2) and an organic solvent to a substrate having trenches in such a manner that the trenches of the substrate are filled with the silicone resin composition so as to form a coating film; and carrying out the step of bringing the coating film into contact with at least one selected from the group consisting of water, an alcohol and hydrogen peroxide and the step of subjecting the coating film to at least one treatment selected from the group consisting of a heat treatment and an optical treatment.

12 Claims, 3 Drawing Sheets

METHOD OF FORMING A TRENCH ISOLATION

TECHNICAL FIELD

The present invention relates to a method of forming a trench isolation.

BACKGROUND ART

"Trench isolation" is known as a technique for separating from one another the devices of semiconductor equipment formed by integrating a large number of devices at a high density. The trench isolation structure is mainly constructed by forming trenches in a silicon substrate by dry etching, filling the trenches with $SiO_2$ and planarizing a surface over the trenches by chemical mechanical polishing (CMP) in the end. This trench isolation has no increase in isolation size caused by a process such as the bird's beak process as compared with an isolation formed by LOCOS (Local Oxidation of Silicon). Therefore, it is suitable for the high integration of devices.

The above trench isolation structure is generally constructed by, for example, the method described in "First Semiconductor Process" (written by Kazuo Maeda, Kogyo Chosakai Publishing Co., Ltd., pp. 166-173, 2001). In the commonly used method of forming a trench isolation, for example, a silicon dioxide ($SiO_2$) film and a silicon nitride ($Si_3N_4$) film as an oxidation mask are first formed on the top surface of a silicon substrate by chemical vapor deposition (CVD).

Then, an etching mask having a trench pattern is formed from a resist on the top surface of the silicon nitride film by ordinary photolithography, and trenches are formed in the silicon substrate through the silicon nitride film and the silicon oxide film by anisotropic etching such as reactive ion etching. Thereafter, a silicon oxide film is formed on the inner wall of each trench by thermal oxidation or chemical vapor deposition, and then a silicon oxide deposition layer is formed on the inside of each trench and the top surface of the silicon nitride film by, for example, chemical vapor deposition. The fillers are planarized by chemical mechanical polishing to form a trench isolation.

However, in the trench isolation formed by the above method, even if an insulator made of silicon dioxide is formed in each trench by chemical vapor deposition having relatively high coverage, when the aspect ratio (trench depth/trench width) of the trench becomes not less than 1, a local void is formed in the inside of the formed silicon dioxide. Therefore, when a heat treatment step is carried out after that, the formed void may expand and destroy the trench isolation.

Then, to form a silicon dioxide deposition layer having few local voids, chemical vapor deposition in which a mixed gas of ozone and tetraethoxysilane (TEOS) is used as a reactive gas is employed. However, even in this method, a local void is formed in the silicon dioxide deposition layer formed in the inside of a trench having an aspect ratio of not less than 2. Since the silicon dioxide deposition layer formed by this chemical vapor deposition process has a lower density than that of a silicon dioxide deposition layer formed by another chemical vapor deposition process, it is difficult to form a silicon dioxide insulator having high resistance.

Further, an expensive vacuum apparatus is required in all the above methods, thereby boosting costs. In addition, since the raw material is gaseous, the methods have problems to be solved, such as the contamination of the apparatus and low production yield due to the generation of foreign matter.

Recently, a method in which a high-molecular weight liquid dihydrosilicon polymer is used as a coating type silicon dioxide precursor has been proposed (refer to JP-A 2007-45859). In this technology, a liquid product which is the distillation residue obtained by removing a low-boiling point component from the hydrolytic condensate of $H_2SiCl_2$ or a high molecular weight liquid product obtained by oxidizing and branching the hydrolytic condensate of $H_2SiCl_2$ with an inorganic acid is used as a silicon dioxide precursor. JP-A 2007-45859 teaches that, when a super high molecular weight silicon dioxide precursor having a weight average molecular weight of more than 500,000 is used in an Example, a good result is obtained. However, when the aspect ratio of a trench formed in the substrate is large, it is difficult to fill the trench with a coating type composition containing the super high molecular weight substance by coating, whereby a local void is readily formed as well.

DISCLOSURE OF THE INVENTION

It is an object of the present invention which has been made in view of the above situation to provide a method of forming a trench isolation, producing no local void even in a substrate having trenches with a large aspect ratio, at a high yield and a high forming rate by simple operation and a simple apparatus without using a vacuum system for CVD or sputtering.

According to the present invention, the above object and advantage of the present invention are attained by a method of forming a trench isolation, comprising the steps of:

applying a silicone resin composition comprising a silicone resin which is represented by the following rational formula (1) and is solid at 120° C.:

$$(H_2SiO)_n(HSiO_{1.5})_m(SiO_2)_k \qquad (1)$$

(wherein n, m and k are each a number, with the proviso that when n+m+k=1, n is 0 to 0.8, m is 0 to 1.0, and k is 0 to 0.2) and an organic solvent to a substrate having trenches in such a manner that the trenches of the substrate are filled with the silicone resin composition so as to form a coating film; and carrying out the following steps (1) and (2) on the coating film in the mentioned order or at the same time to convert at least the filler in the trenches into silicon dioxide:

step (1) of bringing the coating film into contact with at least one selected from the group consisting of water, an alcohol and hydrogen peroxide, and step (2) of subjecting the coating film to at least one treatment selected from the group consisting of a heat treatment and an optical treatment.

Other objects and advantages of the present invention will become apparent from the following description.

BEST MODE FOR CARRYING OUT THE INVENTION

Figure 1:
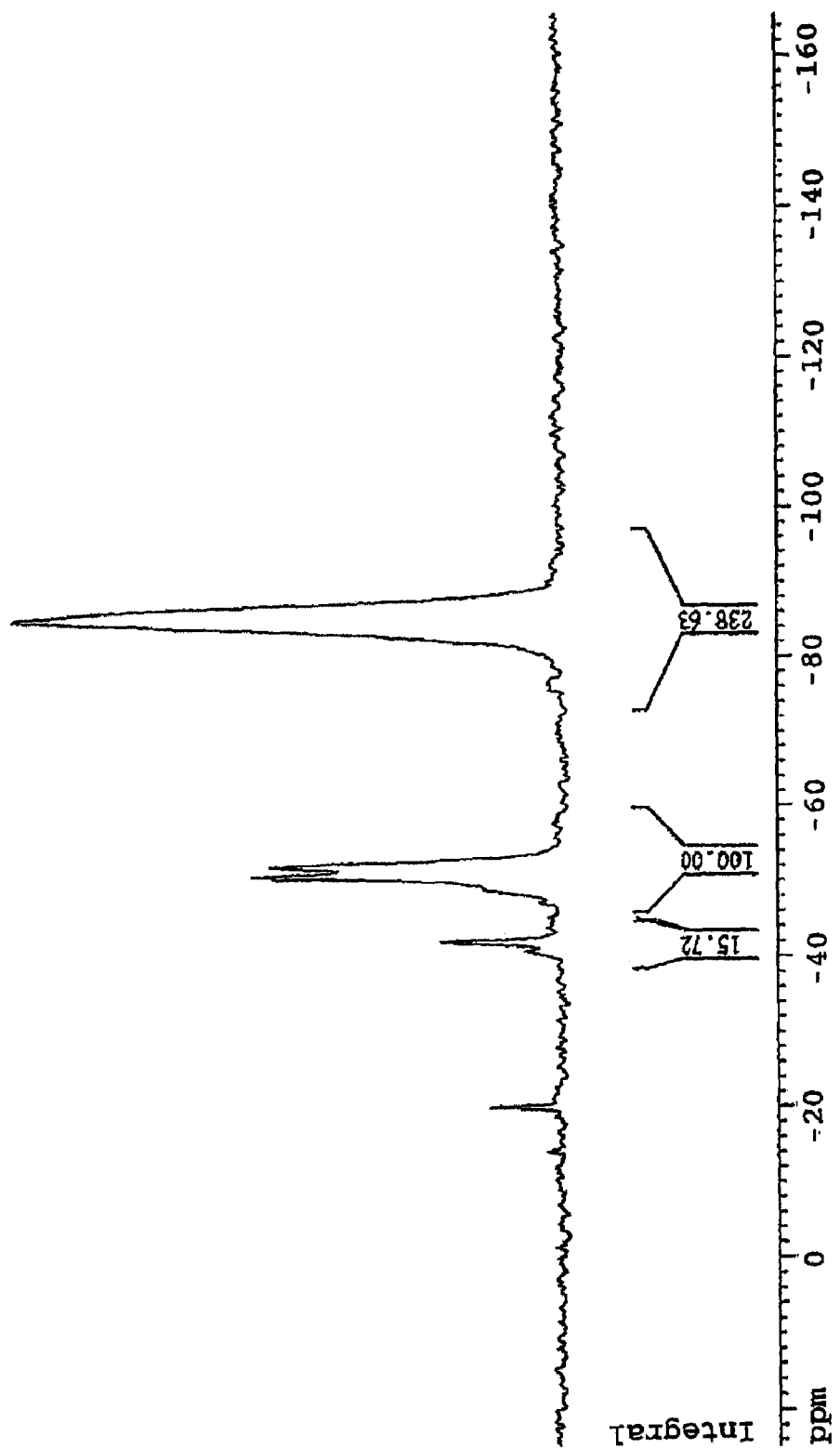
FIG. 1 is a $^{29}$Si-NMR spectral diagram of a silicone resin obtained in Synthesis Example 2.

The present invention will be described in detail hereinunder.
<Silicone Resin>
The silicone resin used in the present invention is represented by the above rational formula (1). The structure of the silicone resin can be a linear, branched, cyclic or cage structure.

In the silicone resin represented by the above rational formula (1) used in the present invention (may be referred to as "silicone resin (1)" hereinafter), when n+m+k=1, n is 0 to 0.8, m is 0 to 1.0, and k is 0 to 0.2.

n is preferably 0.05 to 0.8, more preferably 0.2 to 0.8, much more preferably 0.2 to 0.5, particularly preferably not less than 0.2 and less than 0.5, most preferably 0.2 to 0.4. n may be 0 but when n is not less than 0.05, the solubility in a solvent of the silicone resin (1) can be enhanced. When it is used as a composition prepared by dissolving it in a solvent and spin coating is employed to apply the composition, the occurrence of film formation abnormality such as striation can be prevented without fail.

m is preferably more than 0 and not more than 0.95, more preferably 0.1 to 0.8, much more preferably 0.5 to 0.8, particularly preferably more than 0.5 and not more than 0.8, most preferably 0.6 to 0.8. When m is not more than 0.95, the storage stability of a composition obtained by dissolving the silicone resin (1) in a solvent can be enhanced, and inconvenience such as the gelation of the composition during storage does not occur advantageously.

k is preferably not more than 0.1, particularly preferably 0. When k is more than 0.2, the storage stability of a coating type silicone resin composition prepared by dissolving the silicone resin (1) in an organic solvent is low, whereby the gelation of the composition may occur during storage.

The molecular weight (weight average molecular weight in terms of polystyrene measured by gel permeation chromatography (GPC), this shall apply hereinunder) of the silicone resin (1) is preferably 200 to 500,000, more preferably 1,000 to 100,000, much more preferably 2,000 to 50,000.

The silicone resin (1) is soluble in a general-purpose organic solvent. Therefore, a silicone resin composition comprising the silicone resin (1) and an organic solvent is prepared and may be advantageously used as a coating type silicon dioxide precursor.

The silicone resin (1) is solid at 120° C. Therefore, when a solvent is removed after a silicone resin composition prepared by dissolving this silicone resin in the solvent is applied to a substrate, the coating film after the removal of the solvent becomes stable physically and therefore has a great advantage in terms of handling properties until the subsequent heat treatment step or optical treatment step as compared with conventionally known silicon dioxide precursors (most of them are liquid even after the removal of a solvent).

Further, the silicone resin (1) has an Si—OH content of preferably not more than 5%, more preferably not more than 3% based on the total amount of Si—O bonds. The total amount of Si—O bonds means the total amount of the Si—O bond contained in Si—O—Si and the Si—O bond contained in Si—OH. When the Si—OH bond is existent in the silicone resin in an amount above the range, the storage stability of the silicone resin or the silicone resin composition comprising the silicone resin may become unsatisfactory. Further, it is apprehended that the film may be cracked by compression stress applied to a silicon dioxide film obtained from the silicone resin. However, the silicone resin (1) has no such problems. This Si—OH content can be obtained from the integral value of the $^{29}$Si-NMR spectrum of the silicone resin.
<Method of Producing Silicone Resin>
<Method of Producing Silicone Resin> Described Above Preferably, the above silicone resin of the present invention can be produced by condensing a silicon compound represented by the following formula (2) in an organic solvent under a basic or neutral condition:

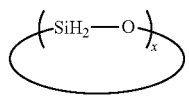

(2)

(in the above formula (2), x is an integer of 3 to 25).

In the above formula (2), x is preferably 3 to 15, more preferably 3 to 8.

The silicon compound represented by the above formula (2) which is preferably used for the synthesis of the silicone resin (1) can be synthesized by hydrolyzing and condensing dichlorosilane in an organic solvent. A third component such as a catalyst may be added at the time of hydrolysis and condensation besides the organic solvent and water.

The organic solvent which may be used herein is not particularly limited as long as it does not react with the silicon compound represented by the above formula (2), the silicone resin component and the third component which is optionally added. Examples of the organic solvent include halogenated hydrocarbon solvents, hydrocarbon solvents, ether solvents and polar solvents. The above halogenated hydrocarbon solvents are preferably chlorinated hydrocarbon solvents such as methylene chloride, chloroform and carbon tetrachloride; the above hydrocarbon solvents include n-pentane, n-hexane, n-heptane, n-octane, decane, dicyclopentane, benzene, toluene, xylene, mesitylene, durene, indene, tetrahydronaphthalene, decahydronaphthalene and squalane; the above ether solvents include diethyl ether, dipropyl ether, dibutyl ether, ethyl butyl ether, ethyl pentyl ether, ethyl hexyl ether, dihexyl ether, dioctyl ether, ethylene glycol dimethyl ether, ethylene glycol diethyl ether, ethylene glycol methyl ethyl ether, diethylene glycol dimethyl ether, diethylene glycol diethyl ether, diethylene glycol methyl ethyl ether, bis(2-methoxyethyl) ether, p-dioxane and tetrahydrofuran; and the above polar solvents include propylene carbonate, γ-butyrolactone, N-methyl-2-pyrrolidone, dimethylformamide and acetonitrile. Out of these, chlorinated hydrocarbon solvents, ether solvents and hydrocarbon solvents are preferred from the viewpoint of the stability of the solution.

The amount of water for the hydrolysis of dichlorosilane is preferably not less than 0.5 mole and less than 5 moles, more preferably 0.5 to 3 moles, much more preferably 0.9 to 1.5 moles based on 1 mole of dichlorosilane. When the amount of water is smaller than 0.5 mol %, an unreacted chloro material remains disadvantageously. The amount of water used in this reaction is the total amount of water which is added to a reaction system specifically and all water which may be existent or contained in the reaction system such as dichlorosilane, the solvent, the third component, the atmosphere and the used apparatus.

The hydrolysis and condensation reaction of the dichlorosilane is carried out at a temperature of preferably −78 to 100° C., more preferably −20 to 50° C. for preferably 0.5 to 3 hours.

Although the silicon compound represented by the above formula (2) is a compound which is stable at room temperature, when it is handled at room temperature, it is preferably handled and stored in the form of a solution dissolved in the above solvent. When it is handled and stored without a solvent, it is desirably handled and stored at 0° C. or lower.

The silicon compound represented by the above formula (2) can be purified by distillation and is desirably subjected to a reaction in the subsequent step after it is purified by distillation. A metal and halogen can be removed by distillation. When the silicon compound represented by the above formula (2) contains impurities such as a metal and halogen, gelation proceeds during storage, and the silicone resin of the present invention may not be obtained. When the silicon compound represented by the above formula (2) is purified by distillation, the purified product obtained by distillation is also desirably stored in a solution state. The reduced pressure at the time of distillation is desirably normal pressure ($1.013 \times 10^5$ Pa) or lower, and the heating temperature at the time of distillation is desirably 200° C. or lower. The particularly preferred distillation conditions are $5 \times 10^1$ to $1 \times 10^4$ Pa and 30 to 90° C.

The silicone resin (1) represented by the above rational formula (1) can be produced by condensing the silicon compound represented by the above formula (2) in an organic solvent under a basic or neutral condition.

To carry out this condensation reaction under a basic condition, a basic catalyst may be used. The basic catalyst may be either an inorganic base or an organic base. Examples of the inorganic base include lithium hydroxide, sodium hydroxide, potassium hydroxide, calcium hydroxide, barium hydroxide, sodium hydrogen carbonate, potassium hydrogen carbonate, sodium carbonate and potassium carbonate. Examples of the organic base include monoalkylamines, dialkylamines, trialkylamines, aromatic amines, diamines, imidazole and derivatives thereof, pyridine and derivatives thereof, piperazine and derivatives thereof, piperazine and derivatives thereof and other nitrogen-containing heterocyclic compounds. Out of these organic bases, the above monoalkylamines include linear, branched and cyclic monoalkylamines, such as n-hexylamine, n-heptylamine, n-octylamine, n-nonylamine, n-decylamine and cyclohexylamine; the above dialkylamines include linear, branched and cyclic dialkylamines such as di-n-butylamine, di-n-pentylamine, di-n-hexylamine, di-n-heptylamine, di-n-octylamine, di-n-nonylamine, di-n-decylamine, cyclohexylmethylamine and dicyclohexylamine; the above trialkylamines include linear, branched and cyclic trialkylamines such as triethylamine, tri-n-propylamine, tri-n-butylamine, tri-n-pentylamine, tri-n-hexylamine, tri-n-heptylamine, tri-n-octylamine, tri-n-nonylamine, tri-n-decylamine, cyclohexyldimethylamine, dicyclohexylmethylamine and tricyclohexylamine; the above aromatic amines include aniline, N-methylaniline, N,N-dimethylaniline, 2-methylaniline, 3-methylaniline, 4-methylaniline, 4-nitroaniline, diphenylamine, triphenylamine and naphthylamine; the above diamines include ethylenediamine, N,N,N',N'-tetramethyl ethylenediamine, tetramethylenediamine, hexamethylenediamine, 4,4'-diaminodiphenylmethane, 4,4'-diaminodiphenyl ether, 4,4'-diaminobenzophenone, 4,4'-diaminodiphenylamine, 2,2-bis(4-aminophenyl)propane, 2-(3-aminophenyl)-2-(4-aminophenyl)propane, 2-(4-aminophenyl)-2-(3-hydroxyphenyl)propane, 2-(4-aminophenyl)-2-(4-hydroxyphenyl)propane, 1,4-bis[1-(4-aminophenyl)-1-methylethyl]benzene and 1,3-bis[1-(4-aminophenyl)-1-methylethyl]benzene; the above imidazole and derivatives thereof include imidazole, benzimidazole, 4-methylimidazole and 4-methyl-2-phenylimidazole; the above pyridine and derivatives thereof include pyridine, 2-methylpyridine, 4-methylpyridine, 2-ethylpyridine, 4-ethylpyridine, 2-phenylpyridine, 4-phenylpyridine, 2-methyl-4-phenylpyridine, nicotin, nicotinic acid, nicotinic acid amide, quinoline, 4-hydroxyquinoline, 8-oxyquinoline and acridine; the above piperazine and derivatives thereof include piperazine and 1-(2-hydroxyethyl)piperazine; and the other nitrogen-containing heterocyclic compounds include pyrazine, pyrazol, pyridazine, quinoxaline, purine, pyrrolidine, piperidine, morpholine, 4-methylmorpholine, 1,4-dimethylpiperazine and 1,4-diazabicyclo[2.2.2]octane.

These basic catalysts may be used alone or in combination of two or more.

The amount of the basic catalyst is preferably not more than 0.01 part by weight based on 100 parts by weight of the silicon compound represented by the above formula (2).

The organic solvent which is used for the condensation of the silicon compound represented by the above formula (2) is not particularly limited as long as it does not react with the silicon compound represented by the above formula (2), the produced silicone resin component and the optionally used basic catalyst.

Examples of the organic solvent include chlorinated hydrocarbon solvents, hydrocarbon solvents, ether solvents and polar solvents. The above chlorinated hydrocarbon solvents include methylene chloride, chloroform and carbon tetrachloride; the above hydrocarbon solvents include n-pentane, n-hexane, n-heptane, n-octane, decane, dicyclopentane, benzene, toluene, xylene, durene, indene, tetrahydronaphthalene, decahydronaphthalene and squalane; the above ether solvents include diethyl ether, dipropyl ether, dibutyl ether, ethyl butyl ether, ethyl pentyl ether, ethyl hexyl ether, ethylene glycol dimethyl ether, ethylene glycol diethyl ether, ethylene glycol methyl ethyl ether, diethylene glycol dimethyl ether, diethylene glycol diethyl ether, diethylene glycol methyl ethyl ether, bis(2-methoxyethyl)ether, p-dioxane and tetrahydrofuran; and the above polar solvents include propylene carbonate, γ-butyrolactone, N-methyl-2-pyrrolidone, dimethylformamide and acetonitrile. Out of these, chlorinated hydrocarbon solvents, ether solvents and hydrocarbon solvents are preferred from the viewpoint of the stability of the solution.

The amount of the solvent is preferably 100 to 10,000 parts by weight based on 100 parts by weight of the silicon compound represented by the above formula (2).

The condensation reaction may be carried out at a temperature of −50 to 200° C., preferably 0 to 100° C. The condensation reaction time is preferably 0.5 to 3 hours.

In the above method, n, m and k in the above formula (1) can be set to desired values by controlling the amount of water. For example, when the amount of water is made small, the value of n can be made large and when the amount of water is made large, the value of m can be made large.

<Silicone Resin Composition>

The silicone resin composition which is used in the present invention comprises the above-described silicone resin (1) and an organic solvent and optionally other components.

The silicone resin may be contained as one of chemical species which are the same in n, m and k in the above formula (1) and molecular weight or a mixture of two or more different chemical species which differ from each other in at least one of n, m, k and molecular weight.

The above other components include a silicone compound represented by the following formula (3), colloidal silica, metal oxide fine powders and a surfactant:

$$(HSiO_{1.5})_j \quad (3)$$

(wherein j is an integer selected from 8, 10, 12, 14 and 16).

The silicone compound represented by the above formula (3) may be used to control the silicon content of the silicone resin composition or the viscosity of the composition. When the silicone resin composition contains the silicone compound represented by the above formula (3), the content of the silicone compound is preferably not more than 30 parts by weight, more preferably not more than 20 parts by weight based on 100 parts by weight of the silicone resin (1).

The above colloidal silica may be used to control the dynamic viscoelasticity of the silicone resin composition. When the silicone resin composition contains the colloidal silica, the content of the colloidal silica is preferably not more than 30 parts by weight, more preferably not more than 20 parts by weight based on 100 parts by weight of the silicone resin (1). The colloidal silica is preferably added while it is dispersed in an organic solvent which can be used for the silicone resin composition and will be described hereinafter.

The above metal oxide fine powders may be used to prevent the gelation of the silicone resin composition, increase the viscosity of the composition, improve the heat resistance, chemical resistance, hardness and adhesion to a substrate of the obtained silicon dioxide film and prevent static electricity. Examples of the metal oxide which can be used herein include aluminum oxide, zirconium oxide and titanium oxide. The number average diameter of the fine powders is preferably 10 to 50 nm. When the silicone resin composition comprises metal oxide fine powders, the content of the metal oxide fine powders is preferably not more than 20 parts by weight, more preferably not more than 10 parts by weight based on 100 parts by weight of the silicone resin (1).

The above surfactant may be cationic, anionic, amphoteric or nonionic. Out of these, the nonionic surfactant is preferably used because it improves the wettability of the silicone resin composition to the substrate and the leveling properties of the coating film and prevent the generation of irregularities on the coating film and the formation of an orange peel. Examples of the nonionic surfactant include fluorine-based surfactants having an fluoroalkyl group or perfluoroalkyl group, polyether alkyl-based surfactants having an oxyalkyl group, and other nonionic surfactants.

Commercially available products of the above fluorine-based surfactant include F Top EF301, EF303 and EF352 (of Shin Akita Kasei Co., Ltd.), Megafac F171 and F173 (of Dainippon Ink and Chemicals, Inc.), Asahi Guard AG710 (of Asahi Glass Co., Ltd.), Florade FC-170C, FC430 and FC431 (of Sumitomo 3M, Limited), Surflon S-382, SC101, SC102, SC103, SC104, SC105 and SC106 (of Asahi Glass Co., Ltd.), BM-1000 and 1100 (of B. M-Chemie), Schsego-Fluor (of Schwegmann GmBH), $C_9F_{19}CONHC_{12}H_{25}$, $C_8F_{17}SO_2NH$—$(C_2H_4O)_6H$, $C_9F_{17}O$ (Pululonic L-35) $C_9F_{17}$, $C_9F_{17}O$ (Pululonic P-84) $C_9F_{17}$ and $C_9F_{17}O$ (Tetronic-704)$(C_9F_{17})_2$ (Pululonic L-35: manufactured by ADEKA Corporation, polyoxypropylene-polyoxyethylene block copolymer, average molecular weight of 1,900; Pululonic P-84: manufactured by ADEKA Corporation, polyoxypropylene-polyoxyethylene block copolymer, average molecular weight of 4,200; Tetronic-704: manufactured by ADEKA Corporation, N,N,N',N'-tetrakis(polyoxypropylene-polyoxyethylene block copolymer), average molecular weight of 5,000 and, for example, the above "$C_9F_{17}O$ (Pululonic L-35)$C_9F_{17}$" means an addition compound having a $C_9F_{17}O$ group and a $C_9F_{17}$ group at the respective terminals of Pululonic L-35.).

Examples of the above polyether alkyl-based surfactant include polyoxyethylene alkyl ethers, polyoxyethylene allyl ethers, polyoxyethylene alkylphenol ethers, polyoxyethylene fatty acid esters, sorbitan fatty acid esters, polyoxyethylene sorbitan fatty acid esters and oxyethylene oxypropylene block polymers. Commercially available products of the polyether alkyl-based surfactant include Emulgen 105, 430, 810 and 920, Leodol SP-40S and TW-L120, Emanol 3199 and 4110, Excel P-40S, Bridge 30, 52, 72 and 92, Arassel 20, Emasol 320, Tween 20 and 60, and Merge 45 (of Kao Corporation), and Noniball 55 (of Sanyo Chemical Industries, Ltd.).

The other nonionic surfactants include polyoxyethylene fatty acid esters, polyoxyethylene sorbitan fatty acid esters and polyalkylene oxide block copolymers, and commercially available products thereof include Chemistat 2500 (of Sanyo Chemical Industries, Ltd.), SN-EX9228 (of SAN NOPCO Ltd.) and Nonal 530 (of Toho Chemical Industry Co., Ltd.).

The amount of the surfactant is preferably not more than 10 parts by weight, particularly preferably 0.1 to 5 parts by weight based on 100 parts by weight of the silicone resin. When the amount of the surfactant is larger than 10 parts by weight, the obtained silicone resin composition tends to foam and may thermally change its color disadvantageously.

The organic solvent used in the silicone resin composition of the present invention is not particularly limited as long as it can dissolve or disperse the silicone resin (1) and the optionally used other components and does not react with these. Examples of the organic solvent include hydrocarbon solvents, ether solvents and polar solvents. The above hydrocarbon solvents include n-pentane, n-hexane, n-heptane, n-octane, decane, dicyclopentane, benzene, toluene, xylene, durene, indene, tetrahydronaphthalene, decahydronaphthalene and squalane; the above ether solvents include diethyl ether, dipropyl ether, dibutyl ether, ethyl butyl ether, ethyl pentyl ether, ethyl hexyl ether, dihexyl ether, dioctyl ether, ethylene glycol dimethyl ether, ethylene glycol diethyl ether, ethylene glycol methyl ethyl ether, diethylene glycol dimethyl ether, diethylene glycol diethyl ether, diethylene glycol methyl ethyl ether, bis(2-methoxyethyl)ether, p-dioxane and tetrahydrofuran; and the above polar solvents include propylene carbonate, γ-butyrolactone, N-methyl-2-pyrrolidone, dimethylformamide and acetonitrile. Out of these, ether solvents and hydrocarbon solvents are preferred from the viewpoint of the stability of the obtained silicone resin composition. These organic solvents may be used alone or in combination of two or more. The amount of the organic solvent which is suitably controlled according to the desired thickness of the silicon dioxide film is preferably not more than 100,000 parts by weight, more preferably 300 to 50,000 parts by weight, much more preferably 400 to 50,000 parts by weight based on 100 parts by weight of the silicone resin (1). When the amount of the organic solvent is larger than 100,000 parts by weight, it may be difficult to form a film from the coating composition. Preferably, the silicone resin composition does not contain water.

The solids content of the silicone resin composition (the ratio of the total weight of components except the solvent of the silicone resin composition to the weight of the composition) is preferably 0.1 to 25 wt %, more preferably 2 to 20 wt %.

The silicone resin composition has a chlorine content of preferably not more than 5 ppm, more preferably not more than 1 ppm. The composition which is used to form a silicon dioxide film and also used to form a trench isolation preferably has a low chlorine content from the viewpoint of the insulating properties of the formed silicon dioxide film. However, as a raw material compound which is used to synthesize a silicon dioxide precursor composition has a chlorine atom in most cases, it has been difficult to reduce the chlorine content of the composition. In the present invention, the above chlorine content can be easily achieved by employing the above-described preferred production method as the method of producing the silicone resin (1) contained in the composition.

<Method of Forming a Trench Isolation>

The above silicone resin composition can be advantageously used to form a trench isolation by filling the trenches of a substrate having trenches with silicon dioxide.

The method of forming a trench isolation according to the present invention can be carried out by applying the above silicone resin composition to a substrate having trenches in such a manner that the trenches of the substrate are filled with the silicone resin composition to form a coating film and carrying out the following steps (1) and (2) on the coating film in the mentioned order or at the same time to covert at least the filler in the trenches into silicon dioxide:

step (1) of bringing the coating film into contact with at least one selected from the group consisting of water, an alcohol and hydrogen peroxide; and step (2) of subjecting the coating film to at least one treatment selected from the group consisting of a heat treatment and an optical treatment.

The material constituting the substrate having trenches is, for example, a silicon substrate.

To form trenches in the silicon substrate, a known method, for example, a method in which an insulating film consisting of a mask nitride layer and a pad oxide layer is deposited on a substrate and etched in a pattern may be employed. The trench width is preferably 1 to 1,000 nm, more preferably 3 to 800 nm, much more preferably 5 to 500 nm, particularly preferably 10 to 200 nm. The aspect ratio of the trench (a value obtained by dividing the depth of the trench by the width of the trench) is preferably not more than 50, more preferably not more than 10. In the conventionally known method of forming a trench isolation, when the aspect ratio of the trench is not less than 2, the density of silicon dioxide in the filler of the trench becomes insufficient, whereby the resistivity of the filler may become unsatisfactory or a void may be formed in the filler of the trench, thereby reducing the product yield. In the method of forming a trench isolation according to the present invention, even in the case of a substrate having trenches with an aspect ratio of not less than 2, specifically not less than 2.5, particularly not less than 3.0, no void is formed in the filler and the trenches can be filled with high-density silicon dioxide.

The surface on which the coating film is to be formed of the substrate having trenches may be either planar or nonplanar with level differences and is not limited to a particular form.

To apply the above silicone resin composition to the substrate having trenches in such a manner that the trenches of the substrate are filled, spin coating, spray coating, curtain coating, bar coating, printing or ink jet coating may be used. Out of these, spin coating and spray coating are preferred. The atmosphere for applying the silicone resin composition is not particularly limited and may be a suitable atmosphere, for example, an inert atmosphere such as nitrogen, argon or helium; a reducing gas atmosphere containing hydrogen; or an oxidizing atmosphere such as general air atmosphere.

After coating, the solvent is removed by preferably heating to fill the trenches with components except for the solvent contained in the silicone resin composition (mainly the silicone resin (1)), and an excess coating film is formed on the substrate at the same time. This heat treatment is carried out at a temperature of preferably 0 to 400° C., more preferably 25 to 350° C. for preferably 0.5 to 300 minutes, more preferably 1 to 30 minutes. The thickness of the coating film after the removal of the solvent (the thickness of the film formed on parts except for the trenches of the substrate) is preferably 5 to 1,000 nm, more preferably 25 to 500 nm. By controlling the thickness of the excess film on the substrate to the above range, the trenches are filled without fail.

The alcohol which is used in the above step (1) is preferably an alcohol in which an alkyl group having 1 to 5 carbon atoms and a hydroxyl group are bonded together. Preferred examples of the alcohol include methanol, ethanol, 1-propanol, isopropanol, 1-butanol, 2-butanol and 1-pentanol.

The hydrogen peroxide in the above step (1) is preferably stabilized hydrogen peroxide. Examples of the stabilizer for hydrogen peroxide include quaternary ammonium hydroxides, quaternary ammonium carbonates, quaternary ammonium carboxylates and quaternary ammonium peroxycarboxylates. The cation moiety of the quaternary ammonium salt in the above stabilizers is, for example, a tetraalkylammonium, benzyl trialkylammonium or alkyl-hydroxyl alkylammonium. Examples of the tetraalkylammonium include tetramethylammonium, tetraethylammonium, tetrapropylammonium, triethylmethylammonium and dodecyltrimethylammonium; examples of the benzyl trialkylammonium include benzyl trimethylammonium; and trimethyl-2-hydroxyethylammonium (choline).

In the above step (1), the above coating film is preferably further brought into contact with at least one selected from the group consisting of a basic compound and an acidic compound in addition to at least one selected from the group consisting of water, an alcohol and hydrogen peroxide.

The basic compound which can be used in the step (1) is either an inorganic basic compound or an organic basic compound. The inorganic basic compound is selected from ammonia, sodium hydroxide, potassium hydroxide, barium hydroxide and calcium hydroxide. The organic basic compound is selected from primary to tertiary amines, an alkoxyamine, an alcohol amine, a diamine, a compound having a hetero ring including a nitrogen atom as a member thereof, and a quaternary ammonium salt. Preferred examples of the primary amine include methylamine, ethylamine, propylamine and butylamine; preferred examples of the secondary amine include N,N-dimethylamine, N,N-diethylamine, N,N-dipropylamine and N,N-dibutylamine; preferred examples of the tertiary amine include trimethylamine, triethylamine, tripropylamine and tributylamine; preferred examples of the alkoxyamine include methoxymethylamine, methoxyethylamine, methoxypropylamine, methoxybutylamine, ethoxymethylamine, ethoxyethylamine, ethoxypropylamine, ethoxybutylamine, propoxymethylamine, propoxyethylamine, propoxypropylamine, propoxybutylamine, butoxymethylamine, butoxyethylamine, butoxypropylamine and butoxybutylamine; preferred examples of the alcohol amine include methanolamine, ethanolamine, propanolamine, butanolamine, N-methyl methanolamine, N-ethyl methanolamine, N-propyl methanolamine, N-butyl methanolamine, N-methyl ethanolamine, N-ethyl ethanolamine, N-propyl ethanolamine, N-butyl ethanolamine, N-methyl propanolamine, N-ethyl propanolamine, N-propyl propanolamine, N-butyl propanolamine, N-methyl butanolamine, N-ethyl butanolamine, N-propyl butanolamine, N-butyl butanolamine, N,N-dimethyl methanolamine, N,N-diethyl methanolamine, N,N-dipropyl methanolamine, N,N-dibutyl methanolamine, N,N-dimethyl ethanolamine, N,N-diethyl ethanolamine, N,N-dipropyl ethanolamine, N,N-dibutyl ethanolamine, N,N-dimethyl propanolamine, N,N-diethyl propanolamine, N,N-dipropyl propanolamine, N,N-dibutyl propanolamine, N,N-dimethyl butanolamine, N,N-diethyl butanolamine, N,N-dipropyl butanolamine, N,N-dibutyl butanolamine, N-methyl dimethanolamine, N-ethyl dimethanolamine, N-propyl dimethanolamine, N-butyl dimethanolamine, N-methyl diethanolamine, N-ethyl diethanolamine, N-propyl diethanolamine, N-butyl diethanolamine, N-methyl dipropanolamine, N-ethyl dipropanolamine, N-propyl dipropanolamine, N-butyl dipropanolamine, N-methyl dibutanolamine, N-ethyl dibutanolamine, N-propyl dibutanolamine, N-butyl dibutanolamine, N-(aminomethyl)methanolamine, N-(aminomethyl)ethanolamine, N-(aminomethyl)propanolamine, N-(aminomethyl)butanolamine, N-(aminoethyl)methanolamine, N-(aminoethyl)ethanolamine, N-(aminoethyl)propanolamine, N-(aminoethyl)butanolamine, N-(aminopropyl)methanolamine, N-(aminopropyl)ethanolamine, N-(aminopropyl)propanolamine, N-(aminopropyl)butanolamine, N-(aminobutyl)methanolamine, N-(aminobutyl)ethanolamine, N-(aminobutyl)propanolamine and N-(aminobutyl)butanolamine; preferred examples of the diamine include tetramethyl ethylenediamine, tetraethyl ethylenediamine, tetrapropyl ethylenediamine, tetrabutyl ethylenediamine, methyl aminomethylamine, methyl aminoethylamine, methyl aminopropylamine, methyl aminobutylamine, ethyl aminomethylamine, ethyl aminoethylamine, ethyl aminopropylamine, ethyl aminobutylamine, propyl aminomethylamine, propyl aminoethylamine, propyl aminopropylamine, propyl aminobutylamine, butyl aminomethylamine, butyl aminoethylamine, butyl aminopropylamine and butyl aminobutylamine; preferred examples of the compound having a hetero ring including a nitrogen atom as a member thereof include pyridine, pyrrole, piperazine, pyrrolidine, piperidine, picoline, morpholine, methylmorpholine, diazabicyclooclane, diazabicyclononane and diazabicycloundecene; and preferred examples of the quaternary ammonium salt include tetramethylammonium hydroxide, tetraethylammonium hydroxide, tetra-n-propylammonium hydroxide, tetra-iso-propylammonium hydroxide, tetra-n-butylammonium hydroxide, tetra-iso-butylammonium hydroxide, tetra-tert-butylammonium hydroxide, tetrapentylammonium hydroxide, tetrahexylammonium hydroxide, tetraheptylammonium hydroxide, tetraoctylammonium hydroxide, tetranonylammonium hydroxide, tetradecylammonium hydroxide, tetraundecylammonium hydroxide, tetradodecylammonium hydroxide, tetramethylammonium bromide, tetramethylammonium chloride, tetraethylammonium bromide, tetraethylammonium chloride, tetra-n-propylammonium bromide, tetra-n-propylammonium chloride, tetra-n-butylammonium bromide, tetra-n-butylammonium chloride, hexadecyltrimethylammonium hydroxide, n-hexadecyltrimethylammonium bromide, n-octadecyltrimethylammonium hydroxide, n-octadecyltrimethylammonium bromide, cetyltrimethylammoium chloride, stearyltrimethylammonium chloride, benzyltrimethylammonium chloride, didecyldimethylammonium chloride, distearyldimethylammonium chloride, tridecylmethylammnoium chloride, tetrabutylammonium hydrogen sulfate, tributylmethylammonium bromide, trioctylmethylammonium chloride, trilaurylmethylammonium chloride, benzyltrimethylammonium hydroxide, benzyltriethylammonium bromide, benzyltributylammonium bromide, phenyltrimethylammonium bromide and choline. Out of these, tetramethylammonium hydroxide, tetraethylammonium hydroxide, tetra-n-propylammonium hydroxide, tetra-n-butylammonium hydroxide, tetramethylammonium bromide, tetramethylammonium chloride, tetraethylammonium bromide, tetraethylammonium chloride, tetra-n-propylammonium bromide and tetra-n-propylammonium chloride are particularly preferred. These basic compounds may be used alone or in combination of two or more.

The acidic compound in the step (1) may be either an inorganic acid or an organic acid. Examples of the inorganic acid include nitric acid, hydrochloric acid, phosphoric acid and sulfuric acid; and examples of the organic acid include acetic acid, formic acid and maleic acid.

To bring the coating film formed on the substrate having trenches into contact with at least one selected from the group consisting of water, an alcohol and hydrogen peroxide or a combination of at least one selected from the group consisting of water, an alcohol and hydrogen peroxide and at least one selected from the group consisting of a basic compound and an acidic compound in the step (1), it/they is/are supplied as a gas into the atmosphere surrounding the coating film, or a solution containing it/them is brought into contact with the coating film.

When at least one selected from the group consisting of a basic compound and an acidic compound is used in the step (1) and is a gaseous compound, that is, the basic compound is an organic basic compound or ammonia, or the acidic compound is acetic acid, formic acid or maleic acid, the former method is preferably employed. In this case, the partial pressure of at least one selected from the group consisting of water, an alcohol and hydrogen peroxide is preferably 0.01 to 5 MPa, more preferably 0.05 to 3 MPa. The partial pressure of at least one selected from the group consisting of a basic compound and an acidic compound is preferably 0.01 to 5 MPa, more preferably 0.05 to 3 MPa.

The total pressure of gases at the time of contact is preferably 0.1 to 10 MPa, more preferably 0.12 to 5 MPa, much more preferably 0.2 to 3 MPa, particularly preferably 0.3 to 2.0 MPa. As a gas except for the water, alcohol, hydrogen peroxide, basic compound and acidic compound may be used air, nitrogen, oxygen, argon or helium.

As for the contact temperature, a temperature which will be described hereinafter as the temperature of a heat treatment in the step (2) may be adopted when the heat treatment is employed in the above step (2) and the steps (1) and (2) are carried out at the same time. In other cases, the temperature is preferably 15 to 300° C., more preferably 20 to 200° C. The contact time is preferably 0.5 to 720 minutes, more preferably 1 to 360 minutes.

Meanwhile, the latter method may be preferably carried out in all cases. At least one selected from the group consisting of water, an alcohol and hydrogen peroxide may be used as a solvent for the above solution, and another suitable solvent may be used. When at least one selected from the group consisting of a basic compound and an acidic compound is used together with at least one selected from the group consisting of water, an alcohol and hydrogen peroxide in the step (1) and the latter method is employed, the concentration of at least one selected from the group consisting of a basic compound and an acidic compound contained in the above solution is preferably 0.001 to 20 wt %, more preferably 0.005 to 10 wt %. Contact between the coating film and the solution in the latter method may be carried out by applying the above solution to the coating film or by immersing the substrate having the coating film in the above solution. In the case of coating, the amount of the solution used for coating is preferably such that the concentration of the $OH^-$ ion of the basic compound or the concentration of the $H^+$ ion of the acidic compound contained in the solution becomes not less than 0.001 mole based on 1 mole of the Si—H bond contained in the coating film.

The contact pressure is preferably 0.1 to 10 MPa, more preferably 0.12 to 5 MPa, much more preferably 0.3 to 3 MPa, particularly preferably 0.5 to 2.0 MPa. The gas used for pressurization is selected from air, nitrogen, oxygen, argon and helium. To achieve the above pressure at the time of contact, the substrate having the coating film is pressurized after it is immersed in the above solution.

As for the contact temperature, a temperature which will be described hereinafter as the temperature of a heat treatment in the step (2) may be adopted when the heat treatment is employed in the above step (2) and the steps (1) and (2) are carried out at the same time. In other cases, the temperature is preferably 15 to 300° C., more preferably 20 to 200° C. The contact time is preferably 0.5 to 10 minutes, more preferably 1 to 5 minutes.

The heat treatment in the above step (2) may be carried out by using general heating means such as hot plate or oven. The heat treatment temperature is preferably 350 to 1,300° C., more preferably 400 to 1,250° C., much more preferably 450 to 1,150° C. The heat treatment step may be carried out at a constant temperature or with a temperature elevating process from room temperature or a certain temperature. When the heat treatment is carried out at a constant temperature, the heat treatment time is preferably 1 to 300 minutes, more preferably 5 to 120 minutes, much more preferably 10 to 60 minutes. When the heat treatment is carried out with the temperature elevating process, the temperature elevation rate is preferably 0.2° C./min to 50° C./min, more preferably 0.5° C./min to 30° C./min. The heat treatment may be carried out in a multi-stage process in which a heat treatment at a constant temperature and a heat treatment with a temperature elevating process are each carried out more than once. In the multi-stage process, the temperature elevation rate may be changed halfway, or the heat treatment time at a constant temperature is set to preferably 1 to 300 minutes, more preferably 5 to 120 minutes, much more preferably 10 to 60 minutes in each stage.

When the heat treatment temperature is lower than 100° C., the film density becomes low and the reaction for converting the silicone resin film into a silicon dioxide film may become unsatisfactory. When the treatment temperature is higher than 1,300° C., the obtained silicon dioxide film may crack disadvantageously. The "treatment temperature" when the multi-stage process is employed means a maximum attained temperature. When the treatment time is shorter than 1 minute, an oxidation reaction may become unsatisfactory and it is not necessary to carry out the heat treatment for a time longer than 300 minutes. When the multi-stage process is employed, the same can be said of the heat treatment time at a constant temperature.

The heat treatment is preferably carried out in an inert atmosphere such as nitrogen or an oxidizing atmosphere such as air, oxygen or saturated water vapor atmosphere. A heat treatment in an inert atmosphere and a heat treatment in an oxidizing atmosphere may be carried out sequentially. In this case, the order of the treatment in an inert atmosphere and the treatment in an oxidizing atmosphere may be arbitrary.

The optical treatment in the step (2) is carried out by exposing the silicone resin film to radiation. For this optical treatment, visible radiation, ultraviolet radiation and far ultraviolet radiation may be used, and a low-pressure or high-pressure mercury lamp or deuterium lamp; discharge light of a rare gas such as argon, krypton or xenon; or an excimer laser such as YAG laser, argon laser, carbon dioxide gas laser, XeF, XeCl, XeBr, KrF, KrCl, ArF or ArCl may be used as a light source. Although these light sources having an output of preferably 10 to 5,000 W are used, an output of 100 to 1,000 W suffices. The wavelength of the above radiation is not particularly limited as long as it is absorbed by the silicone resin contained in the composition or the coating film but preferably 170 to 600 nm. The dose of the radiation is preferably 0.1 to 1,000 J/cm$^2$, more preferably 1 to 100 J/cm$^2$. The preferred atmosphere for the optical treatment differs by the wavelength of the radiation to be applied. In the case of radiation having a wavelength of less than 220 nm, the optical treatment is preferably carried out in an inert atmosphere such as nitrogen and in the case of radiation having a wavelength of not less than 220 nm, the optical treatment is preferably carried out in an oxidizing atmosphere such as air.

The above heat treatment and the optical treatment may be used in combination. In this case, the both treatments may be carried out sequentially or simultaneously. The temperature for carrying out the both treatments simultaneously is preferably room temperature to 500° C., and the treatment time is about 0.1 to 60 minutes.

The above steps (1) and (2) may be carried out in this order or simultaneously. When the steps (1) and (2) are carried out sequentially, the coating film which has been brought into contact with at least one selected from the group consisting of water, an alcohol and hydrogen peroxide and a basic compound in the step (1) may be supplied to the step (2) directly or after it is washed in a suitable solvent.

When the steps (1) and (2) are carried out sequentially, the interval between the step (1) and the step (2) is not particularly limited.

The step (1) and the step (2) are preferably carried out sequentially in this order. At this point, at least one treatment selected from the group consisting of an oxidizing plasma treatment and an ozone treatment is preferably carried out on the above coating film between the step (1) and the step (2).

The above oxidizing plasma treatment can be carried out by carrying out a plasma treatment in a gas containing oxygen (for example, air or an argon gas containing oxygen). As for the conditions of the oxidizing plasma treatment, the flow rate of oxygen can be set to $1\times10^{-3}$ to $1\times10^5$ sscm, the dose of energy for the plasma treatment can be set to 0.5 mJ/cm$^2$ to 100 J/cm$^2$, and the energy intensity can be set to $1\times10^{-5}$ to $1\times10^{10}$ W/cm$^2$. The plasma treatment time can be suitably set to obtain a desired dose according to energy intensity. The treatment temperature is preferably 15 to 300° C., more preferably 20 to 200° C., much more preferably 25 to 100° C.

The above ozone treatment may be carried out by applying short-wavelength radiation (for example, radiation from an excimer lamp generating a bright line at 172 nm, or radiation from a low-pressure mercury lamp generating a strong bright line at 185 nm and 254 nm) in an atmosphere containing oxygen (for example, air or an argon gas containing oxygen). The intensity of the radiation can be set to $1\times10^{-5}$ to $1\times10^{10}$ W/cm$^2$. The treatment time is preferably 0.5 to 120 minutes, more preferably 1 to 60 minutes, much more preferably 1 to 30 minutes. The treatment temperature is preferably 25 to 300° C., more preferably 30 to 200° C., much more preferably 50 to 100° C.

A trench isolation is thus formed in the substrate. In the method of forming a trench isolation according to a preferred embodiment of the present invention, the excess silicon dioxide film is formed on the substrate besides the insides of the trenches but this excess portion should be removed by a suitable method such as chemical mechanical polishing.

The above-described method of forming a trench isolation according to the present invention has an advantage that, even when the aspect ratio of each trench is high, regardless of the area and shape of the substrate having trenches, the trenches can be filled with high-density silicon dioxide having no local void. The trench isolation formed by the method of the present invention is suitable for the manufacture of an electronic device which requires high reliability.

EXAMPLES

The trench filling properties of trench isolations formed in the following Examples and Comparative Examples were evaluated as follows.

A wafer having a trench isolation obtained in each Example or Comparative Example was cut in such a manner that the cross-section of a trench was exposed to the surface, and the cross-section was immersed in an aqueous solution containing 0.5 wt % of hydrogen fluoride for 1 minute, 2 minutes or 3 minutes. After the cross-section was rinsed in water and dried, it was observed through a scanning electron microscope (manufactured by Hitachi, Ltd., S-4300 field emission scanning electron microscope) to evaluate its trench filling properties.

The erosion of silicon dioxide by hydrogen fluoride proceeds more quickly as the crosslinking density of silicon dioxide becomes lower. Therefore, when there is a portion where conversion into silicon dioxide is unsatisfactory in the trench, the portion is eroded by hydrogen fluoride quickly and therefore backs away from the other portion. It is considered that the conversion of the coating type silicon dioxide precursor into silicon dioxide proceeds from the surface of the coating film due to the diffusion of oxygen from the surface of the coating film. Therefore, conversion occurs most hardly in the inside of the trench. When conversion into silicon dioxide in the trench is incomplete (that is, the crosslinking density in the trench is low), this portion backs away from the surface portion of the coating film by the above hydrogen fluoride treatment, whereby it is seen as a so-called "trench filling failure" through the above electron microscope. When this trench filling failure is not seen, the trench filling properties are evaluated as "satisfactory" and when this trench filling failure is seen, the trench filling properties are evaluated as "unsatisfactory". It is considered that when the trench filling properties are "satisfactory" after 1 minute of immersion in an aqueous solution containing 0.5 wt % of hydrogen fluoride, the wafer can withstand the hydrogen fluoride treatment in the semiconductor production process, when the trench filling properties are "satisfactory" after 2 minutes of immersion, the wafer has satisfactory resistance to the ordinary hydrogen fluoride treatment, and when the trench filling properties are "satisfactory" after 3 minutes of immersion, if the process conditions of the hydrogen fluoride treatment are changed, the wafer has satisfactory resistance.

Synthesis Example 1

Synthesis Example of Silicon Compound Represented by the Above Formula (2)

A Dewer condenser, an air introduction tube, a thermometer and a septum were set in a 1-L four-necked flask, and 400 mL of n-butyl ether was fed to the flask in a nitrogen atmosphere. After this reaction system was cooled to $-20°$ C. in a cooling bath, liquefied $H_2SiCl_2$ (84 g, 820 mmol) was injected into the flask by a syringe. Distilled water (14.8 mL, 820 mmol) was added dropwise at the same temperature ($-20°$ C.) over 60 minutes and then stirred for 1 hour. Thereafter, the reaction liquid was transferred to a separatory funnel and washed with 400 mL of distilled water 4 times, and an n-butyl ether layer was dried with magnesium sulfate and filtered to obtain a solution containing a silicon compound (2-1). When this solution containing the silicon compound (2-1) was measured by $^1$H-NMR and $^{29}$Si-NMR, a plurality of peaks derived from Si—$H_2$ were seen at 4.8 to 4.6 ppm in the $^1$H-NMR measurement and other peaks excluding a peak derived from the solvent were not seen. In the $^{29}$Si-NMR measurement, a plurality of peaks derived from [$H_2$—SiO] were seen at $-40$ to $-60$ ppm and other peaks were not seen.

Then, the above solution containing the silicon compound (2-1) was distilled under a reduced pressure of $6.66 \times 10^3$ Pa (50 mmHg) by heating it up to 50° C. to obtain 422 g of a distillate containing the silicon compound (2-1). The weight of the distillation residue was 15.0 g. When this distillate containing the silicon compound (2-1) was measured by $^1$H-NMR, a peak derived from Si—$H_2$ was seen at 4.8 to 4.7 ppm. It was found from the integral ratio of the peak derived from Si—$H_2$ which appeared at 4.8 to 4.7 ppm to a peak derived from n-butyl ether that 4.8 wt % of the silicon compound (2-1) was dissolved in this distillate.

When the condensation degree of the silicon compound (2-1) was measured by $^{29}$Si-NMR, it was found that the silicon compound (2-1) was a mixture of compounds having a condensation degree of 3 to 7.

Synthesis Example 2

Synthesis Example of Silicone Resin Represented by the Above Rational Formula (1)

125 g of the distillate containing the silicon compound (2-1) (containing 4.8 wt % of the silicon compound (2-1)) obtained in the above Synthesis Example 1, n-butyl ether (33 g) and propylene glycol monoethyl ether acetate (20 g) were added to a 300 mL three-necked flask equipped with a thermometer and a dropping funnel in the air and stirred at 0° C., and 1.32 mL of a solution prepared by dissolving triethylamine in n-butyl ether to a concentration of 0.1 wt %, distilled water (0.82 g, 45 mmol) and propylene glycol monoethyl ether acetate (20 g) were added dropwise over 10 minutes and then stirred for 2 hours.

Thereafter, 1.76 g of an n-butyl ether solution containing 0.1 wt % of oxalic acid was added to the reaction liquid to terminate the reaction. The reaction liquid was transferred to a separatory funnel and washed with distilled water 4 times, an organic layer was dried with $MgSO_4$ and filtered, and the solvent was distilled off by an evaporator to obtain 40 g of a homogeneous transparent n-butyl ether solution containing 15 wt % of the silicone resin (1-1).

This n-butyl ether solution containing the silicone resin (1-1) was measured by $^1$H-NMR and $^{29}$Si-NMR. In the $^1$H-NMR measurement, a broad peak derived from Si—$H_2$ was seen at 4.8 to 4.6 ppm, and a broad peak derived from Si—H was seen at 4.5 to 4.3 ppm. In the $^{29}$Si-NMR measurement (the averaging number is 20, FIG. 1), a peak derived from $H_2$Si(—O)$_2$ was seen at $-47$ to $-51$ ppm, a peak derived from HSi(—O)$_3$ was seen at $-80$ to $-87$ ppm, and the integral ratio of these was 30:70. The content of the Si—OH bond was 2.5% based on the total amount of Si—O bonds.

When the chlorine content of the silicone resin-n-butyl ether solution (M) was measured by ion chromatography using a combustion gas absorption method, it was found that the content was not more than 1 ppm which is the detection limit of the measurement method.

When a small amount of the n-butyl ether solution containing the silicone resin (1-1) was collected and the solvent was distilled off under reduced pressure, a white solid was obtained. When this solid was heated at 120° C., it did not melt.

The weight average molecular weight in terms of polystyrene measured by GPC of this silicone resin (1-1) was 30,000.

When the n-butyl ether solution containing the silicone resin (1-1) obtained above was left and stored at room temperature for 24 hours, no change in its appearance was observed and therefore, its storage stability was satisfactory.

Synthesis Example 3

350 mL of n-hexane, 40 mL of methanol, 20 mL of concentrated sulfuric acid and 48.6 g (0.3 mol) of anhydrous ferric chloride were fed to a 1,000-mL three-necked flask equipped with a dropping funnel in nitrogen, and a solution prepared by dissolving 25 g (0.185 mol) of trichlorosilane in 200 mL of n-hexane was added dropwise to the above mixture under cooling with ice over 10 hours. After the end of addition, they were further stirred at room temperature for 2 hours, the reaction liquid was transferred to a separatory funnel, n-butyl ether was added, an organic layer was washed with 100 mL of distilled water 5 times, dried with calcium chloride and potassium carbonate and filtered and removed the solvent, and further solvent substitution work by vacuum distillation was carried out with n-butyl ether three times to obtain 90 g of a homogeneous transparent n-butyl ether solution containing the silicone resin (1-2).

This solution containing the silicone resin (1-2) was measured by $^{1}$H-NMR and $^{29}$Si-NMR. In the $^{1}$H-NMR measurement, only a broad peak derived from Si—H was seen at 4.7 to 4.2 ppm. In the $^{29}$Si-NMR measurement, only a plurality of peaks which seemed to be derived from HSi(—O)$_3$ were seen at −80 to −87 ppm.

When the n-butyl ether solution containing the silicone resin (1-2) obtained above was left and stored at room temperature for 24 hours, no change in its appearance was observed and therefore, its storage stability was satisfactory.

Example 1

The n-butyl ether solution containing the silicone resin (1-1) obtained in the above Synthesis Example 2 as a silicone resin composition was spin coated on an 8-inch silicon wafer having a trench pattern with a pattern size of a line/space ratio of 0.2 μm/0.2 μm and a depth of 300 mm and heated at 80° C. in the air for 1 minute to obtain a coating film. The thickness of this coating film was estimated at about 0.5 μm by measuring the thickness of a coating film which was formed from the same silicone resin composition on another 8-inch silicon wafer having no trench pattern under the same conditions.

Figure 2:
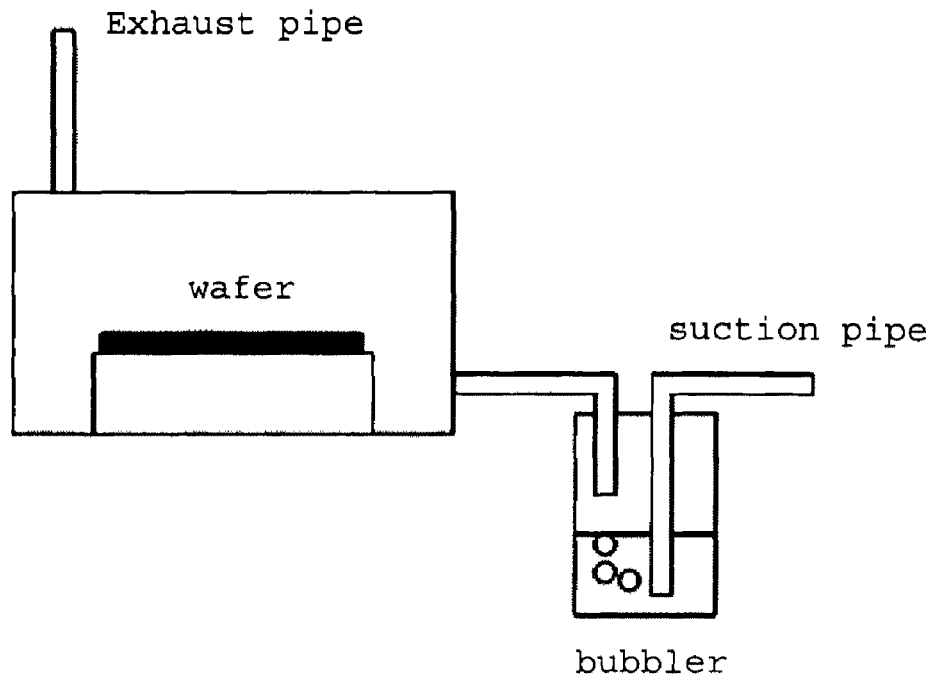
FIG. 2 is a diagram showing the structure of a chamber used in Examples 1 and 2.

This wafer having the coating film was set on a sample table in a chamber equipped with a suction pipe having a bubbler and an exhaust pipe shown in FIG. 2. An aqueous solution containing 28 wt % of ammonia was put into the bottle of the bubbler, the inside temperature of the chamber was set to room temperature, and air was let flow at a rate of 200 mL/min from the inlet (in) of the suction pipe for bubbling so as to supply gaseous ammonia and water into the chamber over 1 hour.

Thereafter, the wafer having the coating film was taken out from the chamber and heated at 500° C. in oxygen for 30 minutes and then at 900° C. in nitrogen for 30 minutes to form a trench isolation.

When the trench filling properties of the trench isolation formed herein were evaluated as described above, they were satisfactory after 2 minutes of immersion in an aqueous solution containing 0.5 wt % of hydrogen fluoride.

Example 2

A trench isolation was formed in the same manner as in Example 1 except that the inside temperature of the chamber at the time of bubbling was changed to 80° C.

When the trench filling properties of the trench isolation formed herein were evaluated as described above, they were satisfactory after 2 minutes of immersion in an aqueous solution containing 0.5 wt % of hydrogen fluoride.

Example 3

A trench isolation was formed in the same manner as in Example 1 except that the heat treatment was carried out at 500° C. in an air atmosphere saturated with water vapor for 30 minutes and then at 900° C. in nitrogen for 30 minutes.

When the trench filling properties of the trench isolation formed herein were evaluated as described above, they were satisfactory after 2 minutes of immersion in an aqueous solution containing 0.5 wt % of hydrogen fluoride.

Example 4

A trench isolation was formed in the same manner as in Example 1 except that the bubbling time was changed to 3 hours and the heat treatment was carried out only at 900° C. in nitrogen for 30 minutes after that.

When the trench filling properties of the trench isolation formed herein were evaluated as described above, they were satisfactory after 2 minutes of immersion in an aqueous solution containing 0.5 wt % of hydrogen fluoride.

Example 5

A trench isolation was formed in the same manner as in Example 1 except that the content of the bubbler bottle was a methanol solution containing 5 wt % of ammonia.

When the trench filling properties of the trench isolation formed herein were evaluated as described above, they were satisfactory after 2 minutes of immersion in an aqueous solution containing 0.5 wt % of hydrogen fluoride.

Example 6

The n-butyl ether solution containing the silicone resin (1-1) obtained in the above Synthesis Example 2 as a silicone resin composition was spin coated on a silicon wafer having the same trench pattern as used in Example 1 and heated at 100° C. in the air for 1 minute to obtain a coating film. The thickness of this coating film was estimated at about 0.5 μm by measuring the thickness of a coating film which was formed from the same silicone resin composition on another 8-inch silicon wafer having no trench pattern under the same conditions.

Figure 3:
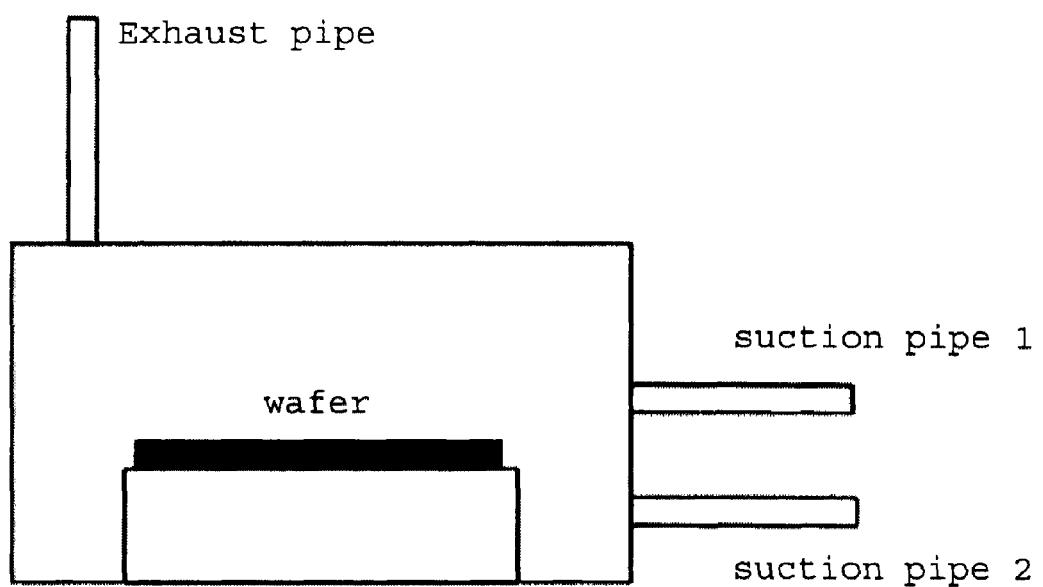
FIG. 3 is a diagram showing the structure of a chamber used in Example 3.

This wafer having the coating film was set on a sample table in a chamber equipped with two suction pipes and one exhaust pipe shown in FIG. 3. Gaseous ammonia was supplied into the suction pipe 1 at a flow rate of 300 sccm and water vapor was supplied into the suction pipe 2 at a flow rate of 300 sccm. At this point, the inside temperature of the chamber was kept at 150° C., and the treatment time was 2 hours.

Thereafter, the wafer having the coating film was taken out from the chamber and heated at 500° C. in the air for 30 minutes and then at 900° C. in nitrogen for 30 minutes to form a trench isolation.

When the trench filling properties of the trench isolation formed herein were evaluated as described above, they were satisfactory after 2 minutes of immersion in an aqueous solution containing 0.5 wt % of hydrogen fluoride.

Example 7

A trench isolation was formed in the same manner as in Example 6 except that the inside temperature of the chamber was set to 500° C. when ammonia and water vapor were supplied.

When the trench filling properties of the trench isolation formed herein were evaluated as described above, they were satisfactory after 2 minutes of immersion in an aqueous solution containing 0.5 wt % of hydrogen fluoride.

Example 8

The n-butyl ether solution containing the silicone resin (1-1) obtained in the above Synthesis Example 2 as a silicone resin composition was spin coated on a silicon wafer having the same trench pattern as used in Example 1 and heated at 200° C. in the air for 1 minute to obtain a coating film. The thickness of this coating film was estimated at about 0.5 μm by measuring the thickness of a coating film which was formed from the same silicone resin composition on another 8-inch silicon wafer having no trench pattern under the same conditions.

10 mL of an isopropanol solution containing 0.1 wt % of triethylamine was added dropwise to this wafer having the coating film on a spin coater which was then turned at 300 rpm for 5 minutes.

Thereafter, the wafer was heated at 600° C. in the air for 60 minutes and then at 1,000° C. in nitrogen for 60 minutes to form a trench isolation.

When the trench filling properties of the trench isolation formed herein were evaluated as described above, they were satisfactory after 2 minutes of immersion in an aqueous solution containing 0.5 wt % of hydrogen fluoride.

Example 9

The n-butyl ether solution containing the silicone resin (1-1) obtained in the above Synthesis Example 2 as a silicone resin composition was spin coated on a silicon wafer having the same trench pattern as used in Example 1 and heated at 200° C. in the air for 1 minute to obtain a coating film. The thickness of this coating film was estimated at about 0.5 μm by measuring the thickness of a coating film which was formed from the same silicone resin composition on another 8-inch silicon wafer having no trench pattern under the same conditions.

This wafer having the coating film was immersed in an isopropanol solution containing 0.5 wt % of ammonia and 0.5 wt % of water at 40° C. for 30 minutes.

The wafer after immersion was rinsed in water, dried and heated at 500° C. in the air for 30 minutes and then at 900° C. in nitrogen for 30 minutes to form a trench isolation.

When the trench filling properties of the trench isolation formed herein were evaluated as described above, they were satisfactory after 2 minutes of immersion in an aqueous solution containing 0.5 wt % of hydrogen fluoride.

Example 10

A trench isolation was formed in the same manner as in Example 9 except that the wafer was immersed in an aqueous solution containing 0.1 wt % of choline at room temperature for 1 hour.

When the trench filling properties of the trench isolation formed herein were evaluated as described above, they were satisfactory after 2 minutes of immersion in an aqueous solution containing 0.5 wt % of hydrogen fluoride.

Example 11

The n-butyl ether solution containing the silicone resin (1-1) obtained in the above Synthesis Example 2 as a silicone resin composition was spin coated on an 8-inch silicon wafer having a trench pattern with a pattern size of a line/space ratio of 80 nm/80 nm and a depth of 400 nm and heated at 80° C. in the air for 1 minute to obtain a coating film. The thickness of this coating film was estimated at about 0.5 μm by measuring the thickness of a coating film which was formed from the same silicone resin composition on another 8-inch silicon wafer having no trench pattern under the same conditions.

This wafer having the coating film was set on a sample table in a chamber equipped with a suction pipe having a bubbler and an exhaust pipe shown in FIG. 2. An aqueous solution containing 28 wt % of ammonia was put into the bottle of the bubbler, the inside temperature of the chamber was set to room temperature, and air was let flow at a rate of 200 sccm from the inlet (in) of the suction pipe for bubbling so as to supply gaseous ammonia and saturated water vapor into the chamber over 1 hour.

Thereafter, the wafer having the coating film was taken out from the chamber and heated at 500° C. for 30 minutes while dry oxygen gas was let flow at a rate of 2,000 sccm and then at 900° C. for 30 minutes while dry nitrogen was let flow at a rate of 10,000 sccm to form a trench isolation.

When the trench filling properties of the trench isolation formed herein were evaluated as described above, they were satisfactory after 1 minute and 2 minutes of immersion in an aqueous solution containing 0.5 wt % of hydrogen fluoride but unsatisfactory after 3 minutes of immersion.

Example 12

A trench isolation was formed in the same manner as in Example 11 except that the heat treatment was carried out at 500° C. for 30 minutes while dry $NH_3$ gas was let flow at a rate of 2,000 sccm and then at 900° C. for 30 minutes while dry nitrogen was let flow at a rate of 10,000 sccm in place of dry oxygen gas.

When the trench filling properties of the trench isolation formed herein were evaluated as described above, they were satisfactory after 1 minute, 2 minutes and 3 minutes of immersion in an aqueous solution containing 0.5 wt % of hydrogen fluoride.

Example 13

The n-butyl ether solution containing the silicone resin (1-1) obtained in the above Synthesis Example 2 as a silicone resin composition was spin coated on a silicon wafer having the same trench pattern as used in Example 11 and heated at 200° C. in the air for 1 minute to obtain a coating film. The thickness of this coating film was estimated at about 0.5 μm by measuring the thickness of a coating film which was formed from the same silicone resin composition on another 8-inch silicon wafer having no trench pattern under the same conditions.

This wafer having the coating film was immersed in a mixture of 10 g of an aqueous solution containing 14 wt % of hydrogen peroxidized tetramethylammonium hydroxide, 5 g of an aqueous solution containing 28 wt % of ammonia and 265 g of water at 25° C. for 30 minutes.

The wafer after immersion was rinsed in water, dried and heated at 500° C. for 30 minutes while dry oxygen gas was let flow at a rate of 2,000 sccm and then at 900° C. for 30 minutes while dry nitrogen was let flow at a rate of 10,000 sccm to form a trench isolation.

When the trench filling properties of the trench isolation formed herein were evaluated as described above, they were satisfactory after 1 minute, 2 minutes and 3 minutes of immersion in an aqueous solution containing 0.5 wt % of hydrogen fluoride.

Example 14

A trench isolation was formed in the same manner as in Example 11 except that the following plasma oxidation step was carried out between the steps (1) and (2).

As the plasma oxidation step, the coating film after the step (1) was exposed to oxygen plasma at room temperature for 3 minutes by using the Compact Etcher FA-1 of Samco International, Inc.

When the trench filling properties of the trench isolation formed herein were evaluated as described above, they were satisfactory after 1 minute, 2 minutes and 3 minutes of immersion in an aqueous solution containing 0.5 wt % of hydrogen fluoride.

Example 15

A trench isolation was formed in the same manner as in Example 11 except that the n-butyl ether solution containing the silicone resin (1-2) obtained in the above Synthesis Example 3 was used.

When the trench filling properties of the trench isolation formed herein were evaluated as described above, they were satisfactory after 1 minute of immersion in an aqueous solution containing 0.5 wt % of hydrogen fluoride but unsatisfactory after 2 minutes and 3 minutes of immersion.

Example 16

A trench isolation was formed in the same manner as in Example 12 except that the n-butyl ether solution containing the silicone resin (1-2) obtained in the above Synthesis Example 3 was used.

When the trench filling properties of the trench isolation formed herein were evaluated as described above, they were satisfactory after 1 minute and 2 minutes of immersion in an aqueous solution containing 0.5 wt % of hydrogen fluoride but unsatisfactory after 3 minutes of immersion.

Example 17

A trench isolation was formed in the same manner as in Example 13 except that the n-butyl ether solution containing the silicone resin (1-2) obtained in the above Synthesis Example 3 was used.

When the trench filling properties of the trench isolation formed herein were evaluated as described above, they were satisfactory after 1 minute and 2 minutes of immersion in an aqueous solution containing 0.5 wt % of hydrogen fluoride but unsatisfactory after 3 minutes of immersion.

Example 18

A trench isolation was formed in the same manner as in Example 14 except that the n-butyl ether solution containing the silicone resin (1-2) obtained in the above Synthesis Example 3 was used.

When the trench filling properties of the trench isolation formed herein were evaluated as described above, they were satisfactory after 1 minute and 2 minutes of immersion in an aqueous solution containing 0.5 wt % of hydrogen fluoride but unsatisfactory after 3 minutes of immersion.

Example 19

The n-butyl ether solution containing the silicone resin (1-1) obtained in the above Synthesis Example 2 as a silicone resin composition was spin coated on an 8-inch silicon wafer having the same trench pattern as used in Example 11 and heated at 80° C. in the air for 1 minute to obtain a coating film. The thickness of this coating film was estimated at about 0.6 µm by measuring the thickness of a coating film which was formed from the same silicone resin composition on another 8-inch silicon wafer having no trench pattern under the same conditions.

This wafer having the coating film was put into an airtight pressure-resistant container containing 100 g of a 5 wt % $NH_3$ aqueous solution and left in a furnace having an ambient temperature of 150° C. to expose the coating film to ammonia vapor and water vapor generated in the container under an increased pressure (2.7 MPa) for 1 hour. Thereafter, the wafer having the coating film was taken out from the chamber and heated at 400° C. for 30 minutes while dry oxygen gas was let flow at a rate of 2,000 sccm and then at 900° C. for 30 minutes while dry nitrogen was let flow at a rate of 10,000 sccm to form a trench isolation.

When the trench filling properties of the trench isolation formed herein were evaluated as described above, they were satisfactory after 1 minute and 2 minutes of immersion in an aqueous solution containing 0.5 wt % of hydrogen fluoride.

Example 20

The procedure of Example 19 was repeated until the point before the heat treatment and then a heat treatment was carried out at 900° C. for 30 minutes while dry nitrogen was let flow at a rate of 10,000 sccm to form a trench isolation.

When the trench filling properties of the trench isolation formed herein were evaluated as described above, they were satisfactory after 1 minute and 2 minutes of immersion in an aqueous solution containing 0.5 wt % of hydrogen fluoride.

Example 21

The procedure of Example 19 was repeated until a coating film was formed. The wafer having this coating film was put into an airtight pressure-resistant container containing 100 g of water and left in a furnace having an ambient temperature of 150° C. to expose the coating film to water vapor generated in the container under an increased pressure (2.7 MPa) for 1 hour. Thereafter, the wafer having the coating film was taken out from the chamber and heated at 400° C. for 30 minutes while dry oxygen gas was let flow at a rate of 2,000 sccm and then at 900° C. for 30 minutes while dry nitrogen was let flow at a rate of 10,000 sccm to form a trench isolation.

When the trench filling properties of the trench isolation formed herein were evaluated as described above, they were satisfactory after 1 minute and 2 minutes of immersion in an aqueous solution containing 0.5 wt % of hydrogen fluoride.

Example 22

The procedure of Example 19 was repeated until a coating film was formed. The wafer having this coating film was put into an airtight pressure-resistant container containing 100 g of a 0.1 wt % nitric acid aqueous solution and left in a furnace having an ambient temperature of 150° C. to expose the coating film to vapor generated in the container under an increased pressure (2.7 MPa) for 1 hour. Thereafter, the wafer having the coating film was taken out from the chamber and heated at 400° C. for 30 minutes while dry oxygen gas was let flow at a rate of 2,000 sccm and then at 900° C. for 30 minutes while dry nitrogen was let flow at a rate of 10,000 sccm to form a trench isolation.

When the trench filling properties of the trench isolation formed herein were evaluated as described above, they were satisfactory after 1 minute and 2 minutes of immersion in an aqueous solution containing 0.5 wt % of hydrogen fluoride.

Example 23

The procedure of Example 22 was repeated until the point before the heat treatment and then a heat treatment was carried out at 900° C. for 30 minutes while dry nitrogen was let flow at a rate of 10,000 sccm to form a trench isolation.

When the trench filling properties of the trench isolation formed herein were evaluated as described above, they were satisfactory after 1 minute and 2 minutes of immersion in an aqueous solution containing 0.5 wt % of hydrogen fluoride.

Comparative Example 1

The n-butyl ether solution containing the silicone resin (1-1) obtained in the above Synthesis Example 2 as a silicone resin composition was spin coated on an 8-inch silicon wafer having a trench pattern with a pattern size of a line/space ratio of 0.2 μm/0.2 μm and a depth of 300 nm and heated at 80° C. in the air for 1 minute to obtain a coating film. The thickness of this coating film was estimated at about 0.5 μm by measuring the thickness of a coating film which was formed from the same silicone resin composition on another 8-inch silicon wafer having no trench pattern under the same conditions.

Thereafter, the wafer having the coating film was taken out from the chamber and heated at 500° C. in oxygen for 30 minutes and then at 900° C. in nitrogen for 30 minutes to form a trench isolation.

When the trench filling properties of the trench isolation formed herein were evaluated as described above, they were unsatisfactory as a trench filling failure was seen after 2 minutes of immersion in an aqueous solution containing 0.5 wt % of hydrogen fluoride.

Comparative Example 2

The n-butyl ether solution containing the silicone resin (1-1) obtained in the above Synthesis Example 2 as a silicone resin composition was spin coated on an 8-inch silicon wafer having a trench pattern with a pattern size of a line/space ratio of 0.2 μm/0.2 μm and a depth of 300 nm and heated at 80° C. in the air for 1 minute to obtain a coating film. The thickness of this coating film was estimated at about 0.5 μm by measuring the thickness of a coating film which was formed from the same silicone resin composition on another 8-inch silicon wafer having no trench pattern under the same conditions.

Figure 4:
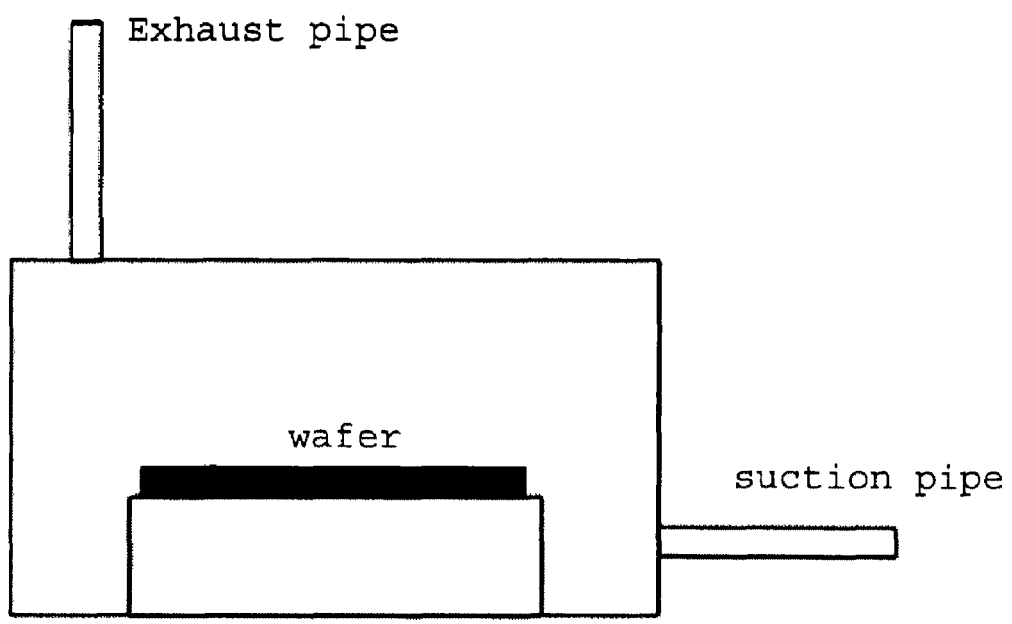
FIG. 4 is a diagram showing the structure of a chamber used in Comparative Example 2.

This wafer having the coating film was set on a sample table in a chamber equipped with a suction pipe and an exhaust pipe shown in FIG. 4, and gaseous ammonia was supplied into the suction pipe (in) at a rate of 300 sccm. The inside temperature of the chamber was kept at 150° C., and the treatment time was 2 hours.

Thereafter, the wafer having the coating film was taken out from the chamber and heated at 500° C. in the air for 30 minutes and then at 900° C. in nitrogen for 30 minutes to form a trench isolation.

When the trench filling properties of the trench isolation formed herein were evaluated as described above, they were unsatisfactory as a trench filling failure was seen after 2 minutes of immersion in an aqueous solution containing 0.5 wt % of hydrogen fluoride.

Comparative Example 3

The procedure of Example 11 was repeated to form a trench isolation except that the $NH_3$/water vapor exposure step was skipped.

When the trench filling properties of the trench isolation formed herein were evaluated as described above, they were unsatisfactory after 1 minute, 2 minutes and 3 minutes of immersion in an aqueous solution containing 0.5 wt % of hydrogen fluoride.

Comparative Example 4

The procedure of Example 15 was repeated to form a trench isolation except that the $NH_3$/water vapor exposure step was skipped.

When the trench filling properties of the trench isolation formed herein were evaluated as described above, they were unsatisfactory after 1 minute, 2 minutes and 3 minutes of immersion in an aqueous solution containing 0.5 wt % of hydrogen fluoride.

The invention claimed is:

1. A method of forming a trench isolation, comprising:
(a) applying a silicone resin composition to a substrate having trenches in such a manner that the trenches of the substrate are filled with the silicone resin composition so as to form a coating film, wherein said silicone resin composition comprises an organic solvent and a silicone resin which is represented by formula (1) and is solid at 120° C.:

$$(H_2SiO)_n(HSiO_{1.5})_m(SiO_2)_k \qquad (1)$$

wherein n, m and k are each a number, with the proviso that when n+m+k=1, n is 0 to 0.8, m is 0 to 0.8, and k is 0 to 0.2;
(b) bringing the coating film into contact with at least one selected from the group consisting of water, an alcohol and hydrogen peroxide; and
(c) subjecting the coating film to at least one treatment selected from the group consisting of a heat treatment and an optical treatment;
wherein (b) is performed before (c) or at the same time as (c) and the silicone resin composition in the trenches of the substrate is converted into silicon dioxide; and
wherein the silicone resin of formula (1) is produced by condensing a silicon compound of formula (2) in an organic solvent under a basic or neutral condition

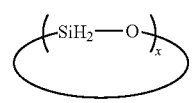

(2)

wherein x is an integer of 3 to 25.

2. The method of forming a trench isolation according to claim 1, wherein the coating film is brought into contact with at least one selected from the group consisting of a basic compound and an acidic compound, in addition to at least one selected from the group consisting of water, an alcohol and hydrogen peroxide, in (b).

3. The method of forming a trench isolation according to claim 1, wherein n in formula (1) is 0.05 to 0.8, and m is more than 0 and not more than 0.8.

4. The method of forming a trench isolation according to claim 1, wherein (b) is carried out at a pressure of 0.1 to 10 MPa.

5. The method of forming a trench isolation according to claim 1, wherein (b) is performed before (c).

6. The method of forming a trench isolation according to claim 5, further comprising carrying out at least one treatment selected from the group consisting of an oxidizing plasma treatment and an ozone treatment on the coating film between (b) and (c).

7. The method of forming a trench isolation according to claim 1, wherein k in formula (1) is 0.

8. The method of forming a trench isolation according to claim 1, wherein the content of the Si—OH bond obtained from the integral value of the $^{29}$Si-NMR spectrum of the silicone resin is not more than 5% based on the total amount of Si—O bonds.

9. The method of forming a trench isolation according to claim 1, wherein the substrate having trenches has trenches with a width of 1 to 1,000 nm and an aspect ratio of 2 to 50.

10. The method of forming a trench isolation according to claim 1, wherein (b) and (c) are carried out at the same time.

11. The method of forming a trench isolation according to claim 1, wherein the silicone resin composition further comprises one or more selected from the group consisting of colloidal silica, a metal oxide fine powder, a surfactant, and a silicone compound of formula (3)

$$(\text{HSiO}_{1.5})_j \qquad (3)$$

wherein j is 8, 10, 12, 14 or 16.

12. The method of forming a trench isolation according to claim 11, wherein the silicone resin composition comprises the silicone compound of formula (3), and the amount of the silicone compound of formula (3) is not more than 30 parts by weight based on 100 parts by weight of the silicone resin of formula (1).

* * * * *